(12) United States Patent
Jones et al.

(10) Patent No.: US 8,466,541 B2
(45) Date of Patent: Jun. 18, 2013

(54) LOW INDUCTANCE POWER MODULE

(75) Inventors: Patrick Jones, Soest (DE); André Christmann, Novi, MI (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/285,265

(22) Filed: Oct. 31, 2011

(65) Prior Publication Data
US 2013/0105961 A1     May 2, 2013

(51) Int. Cl.
*H01L 23/02* (2006.01)
(52) U.S. Cl.
USPC .................... 257/678; 257/691; 257/690
(58) Field of Classification Search
USPC ........... 257/691, 678, 693, 690, 689, 698
See application file for complete search history.

(56) References Cited

U.S. PATENT DOCUMENTS

| | | | |
|---|---|---|---|
| 2008/0106160 A1* | 5/2008 | Yoshinari et al. | 310/68 D |
| 2010/0157640 A1* | 6/2010 | Azuma et al. | 363/132 |
| 2012/0112201 A1* | 5/2012 | Otsuka et al. | 257/76 |
| 2012/0181682 A1* | 7/2012 | Soyano | 257/692 |
| 2012/0256194 A1* | 10/2012 | Yoshihara et al. | 257/77 |

* cited by examiner

*Primary Examiner* — S. V. Clark
(74) *Attorney, Agent, or Firm* — Murphy, Bilak & Homiller, PLLC

(57) ABSTRACT

A power module includes a housing, a power semiconductor die enclosed within the housing and a first power terminal embedded in the housing and electrically connected to the power semiconductor die. A portion of the first power terminal protrudes outward from an external surface of the housing. The power module further includes a second power terminal embedded in the housing and electrically connected to the power semiconductor die and electrically insulated from the first power terminal. A portion of the second power terminal protrudes outward from the external surface of the housing by a distance less than the portion of the first power terminal so that the module has power connections with different heights.

22 Claims, 5 Drawing Sheets

LOW INDUCTANCE POWER MODULE

TECHNICAL FIELD

The present application relates to power modules, in power modules with low inductance power terminals.

BACKGROUND

As few parts as possible are typically used when designing low cost power modules. One part required for the manufacture of a power module which can easily be duplicated is the contact for the power connections. Conventional power module designs have the power connections positioned within the module and protruding outward from the module at the same fixed height for ease of handling. For example, the positive (+) and negative (−) DC supply terminals of a power module conventionally have the same height. An external electrical connector is provided with corresponding bus bars for connecting to the power terminals of the module. To ensure a low inductance design, the positive bus bar of the external connector is typically placed over the negative bus bar with an intermediary insulating material separating the bus bars from one another. Because the power terminals extending from the module have the same height, the topmost bus bar (e.g. the positive DC bus bar in this case) must be bent so that the other bus bar (the negative bus bar in this example) can be placed under the upper bus bar to ensure a low inductance design. However, forming of the bus bars in this way by bending has the disadvantages of being expensive, inaccurate and requiring space to ensure that isolation distances are satisfied.

SUMMARY

The embodiments described herein provide power connections with different heights so that a dual bus-bar electrical connector can be attached to the power module with a higher overlapping of the parallel plates. Such a multi-height connection arrangement reduces stray inductance, simplifies module design, lowers the cost of the bus bar connector and reduces the isolation space needed between the connection power cabling potentials of the module.

According to an embodiment of a power module, the module includes a housing, a power semiconductor die enclosed within the housing and a first power terminal embedded in the housing and electrically connected to the power semiconductor die. A portion of the first power terminal protrudes outward from an external surface of the housing. The power module further includes a second power terminal embedded in the housing and electrically connected to the power semiconductor die and electrically insulated from the first power terminal. A portion of the second power terminal protrudes outward from the external surface of the housing by a distance less than the portion of the first power terminal so that the module has power connections with different heights.

According to another embodiment of a power module, the module includes a housing, a power semiconductor die enclosed within the housing and a first power terminal having a proximal end embedded in the housing and a distal end spaced away from the housing by a first distance. The first power terminal is electrically connected to the power semiconductor die. The power module further includes a second power terminal having a proximal end embedded in the housing and a distal end spaced away from the housing by a second distance less than the first distance. The second power terminal is electrically connected to the power semiconductor die and electrically insulated from the first power terminal.

According to an embodiment of a power module system, the system includes a housing, a power semiconductor die enclosed within the housing and a first power terminal having a proximal end embedded in the housing and a distal end spaced away from the housing by a first distance. The first power terminal is electrically connected to the power semiconductor die. The power module system further includes a second power terminal having a proximal end embedded in the housing and a distal end spaced away from the housing by a second distance less than the first distance. The second power terminal is electrically connected to the power semiconductor die and electrically insulated from the first power terminal. The power module system also includes an electrical connector including a first conductive layer and a second conductive layer separated from the first conductive layer by an insulating material. The first conductive layer is connected to the distal end of the first power terminal and the second conductive layer is connected to the distal end of the second power terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
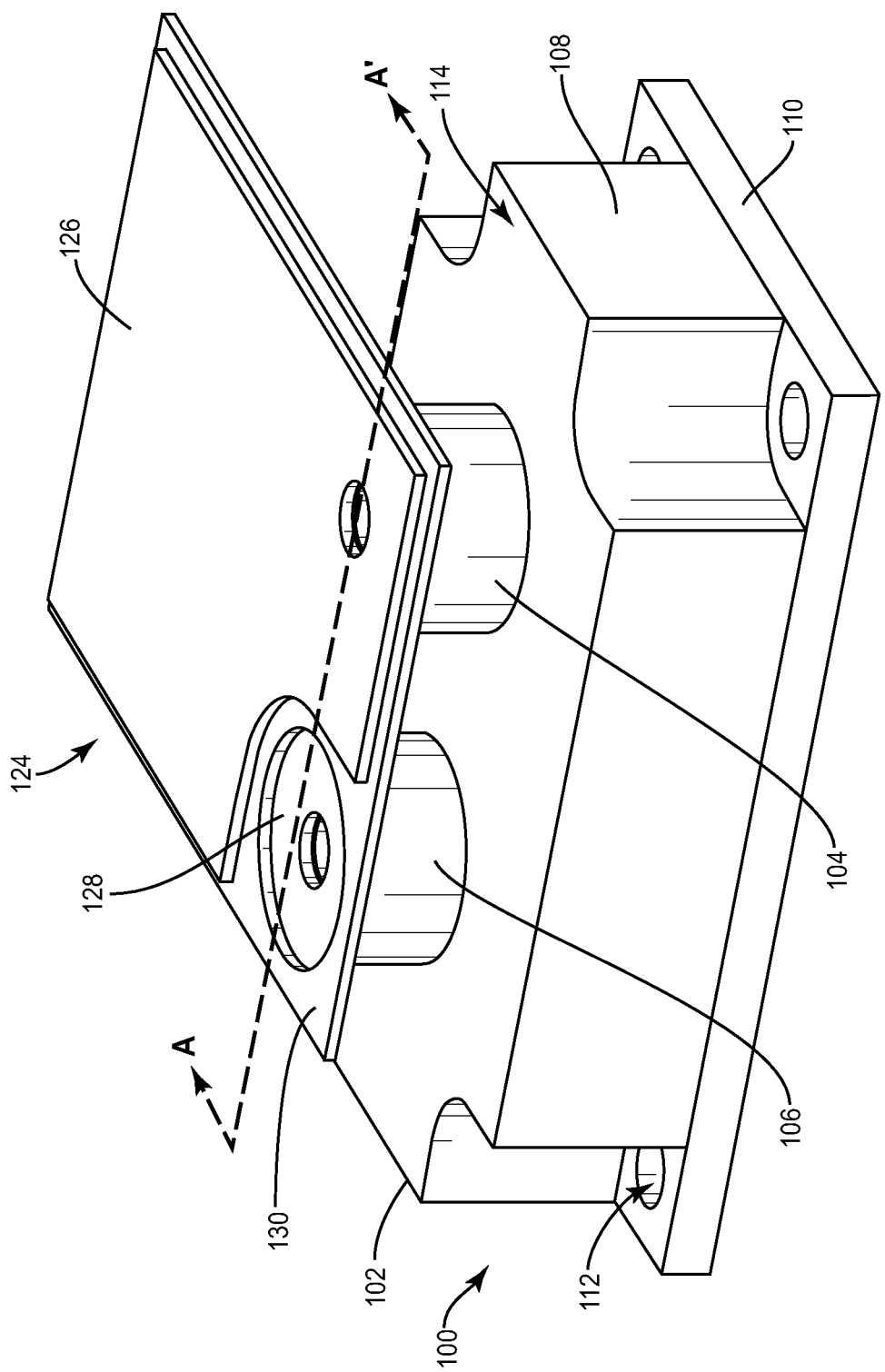
FIG. 1 illustrates a perspective view of a power module with low inductance power terminals.
Figure 2:
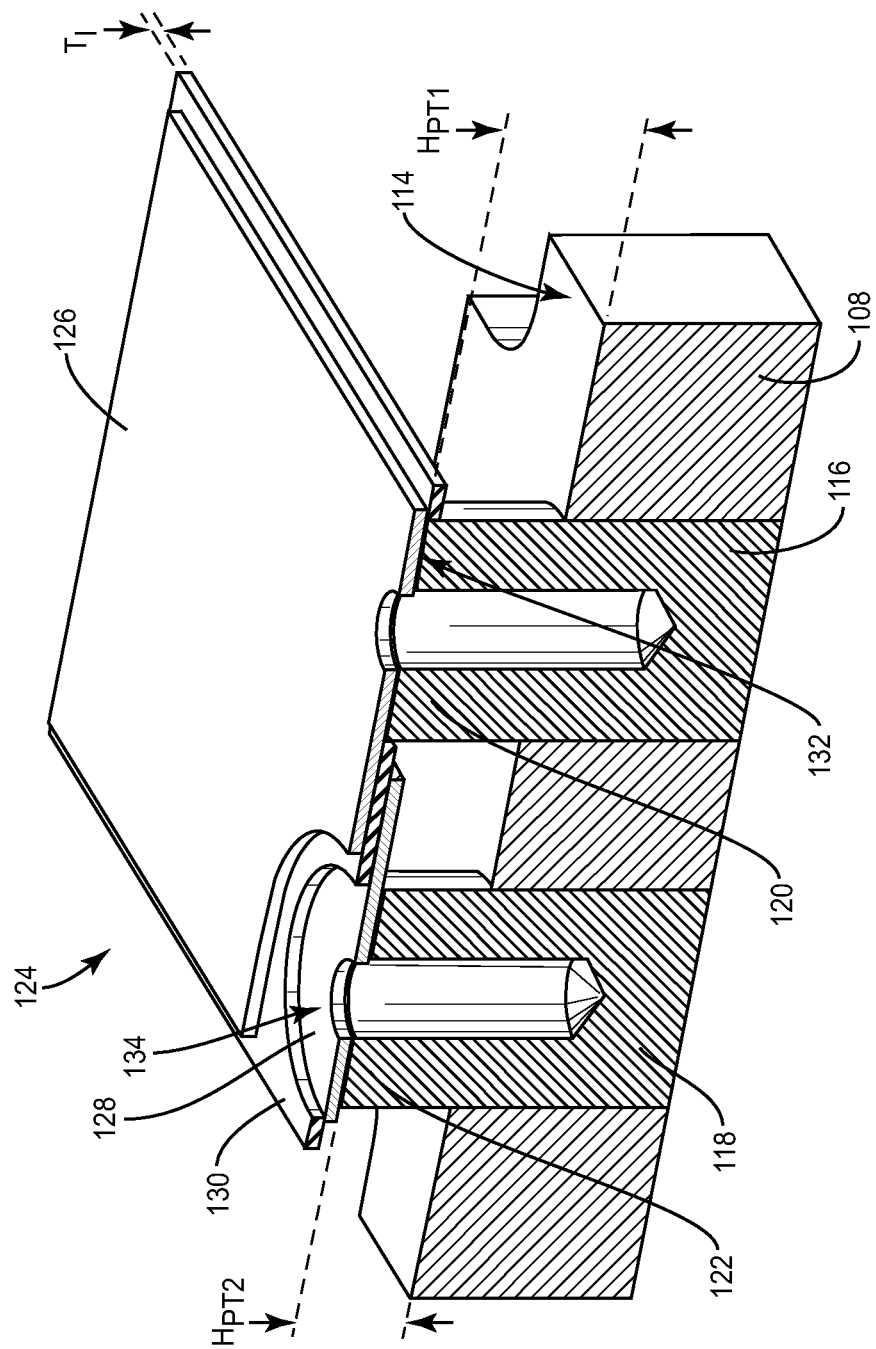
FIG. 2 illustrates a partial cross-sectional view of the power module in FIG. 1.

FIG. 1 illustrates an embodiment of a power module 100 which includes a housing 102, a power semiconductor die (not visible) enclosed within the housing 102, a first power terminal 104 and a second power terminal 106. FIG. 2 illustrates a partial cross-sectional view of the power module 100 shown in FIG. 1 along the line labelled A-A'. FIG. 2 shows the housing 102 and the power terminals 104, 106, but not the components enclosed with the housing 102. Exemplary internal components of the power module 100 can be seen in FIGS. 3-5 which are described later herein.

Each power terminal 104, 106 of the module 100 is embedded in the housing 102 and electrically connected to the power semiconductor die inside the housing 102. In one embodiment, the housing 102 includes a plastic frame 108 attached to a metal body 110. The metal body 110 has holes 112 along the periphery for securing the module 100 e.g. to a heat set or other type of cooler. Each power terminal 104, 106 has an external portion which protrudes outward from an external surface 114 of the housing 102. The external portion of the second power terminal 106 protrudes outward from the external surface 114 of the housing 102 by a distance less than the external portion of the first power terminal 104 so that the module 100 has power connections with different heights.

In other words, each power terminal 104, 106 has a proximal end 116, 118 embedded in the housing 102 and a distal end 120, 122 spaced away from the housing 102 by a particular distance. The distal end 120 of the first power terminal 104 is spaced further away from the housing 102 than the distal end 122 of the second power terminal 106, resulting in the first power terminal 104 having a greater external height with reference to the external surface 114 of the housing 102 than the second power terminal 106. The height of the first power terminal 104 is labelled $H_{PT1}$ and the height of the second power terminal 106 is labelled $H_{PT2}$ in FIG. 2. In one embodiment, the first power terminal 104 is a positive (+) DC supply terminal for the power semiconductor die inside the housing 102 and the second power terminal 106 is a negative (−) supply terminal for the power semiconductor die. Any number of power semiconductor die may be included in the housing 102, and any type of power semiconductor device may be used e.g. such as IGBTs (insulated gate bipolar transistors), power MOSFETs (metal oxide semiconductor field effect transistors), JFETs (junction field effect transistors), power diodes, etc.

An electrical connector 124 can be attached to the power terminals 104, 106 of the module 100 to form a power module system. The electrical connector 124 includes a first conductive layer 126 and a second conductive layer 128 separated from the first conductive layer 126 by an insulating material 130. The first conductive layer 126 of the electrical connector 124 is spaced further away from the housing 102 than the second conductive layer 128, and thus the first conductive layer 126 is also referred to herein as the upper conductive layer and the second conductive layer 128 as the lower conductive layer. In an embodiment, each conductive layer 126, 128 is a bus bar i.e. a strip of copper or aluminium as shown in FIGS. 1 and 2. Such an arrangement of overlying bus bars lowers the stray inductance of the system due to counteracting magnetic fields generated by the bus bars during operation of the module 100 (e.g. when one bus bar is coupled to DC+ and the other bus bar is coupled to DC− or ground).

The upper conductive layer 126 is connected to the distal end 120 of the first power terminal 104 and the lower conductive layer 128 is connected to the distal end 122 of the second power terminal 106. The power terminals 104, 106 have different heights as described above so that a dual bus bar type electrical connector 124 can be connected to the power module 100 with a higher overlapping of the plates 124, 126 as shown in FIGS. 1 and 2. Moreover, having power terminals 104, 106 with different heights enables the use of flat copper or aluminum plates as the conductors 126, 128 of the electrical connector 124 which is easier to manufacture and laminate, since the intermediary insulating material 130 can be glued to the flat plates 126, 128. Unlike conventional plates which have folds or bends to accommodate power terminals with the same height, the conductive plates 126, 128 of the electrical connector 124 are free of folds and bends near the connection point with the module power terminals 104, 106 of the module 100 which reduces the manufacturing cost of the plates and yields a higher proportion of overlapping plates and hence a lower stray inductance. Such a multi-height power terminal connection arrangement not only reduces stray inductance, but also simplifies module design, lowers the cost of the bus bar connector 124 and reduces the isolation space needed between the connection power cabling potentials of the module 100.

As shown in FIGS. 1 and 2, the height difference ($H_{PT1}$−$H_{PT2}$) between the first and second power terminals 104, 106 corresponds to a thickness ($T_I$) of the electrical connector insulating material 130. In one embodiment, the insulating material 130 has a first opening 132 aligned with the first power terminal 104 and a second opening 134 aligned with the second power terminal 106. The lower conductive layer 128 of the electrical connector 124 is disposed closer to the housing 102 than the upper conductive layer 126 as described above, and the upper conductive layer 126 contacts the distal end 120 of the first power terminal 104 through the corresponding opening 132 in the insulating material 130. The other opening 134 in the insulating material 130 allows for a screw type connector to directly contact the top surface of the upper conductive layer 126 when attaching the electrical connector 124 to the module 100.

Figure 3:
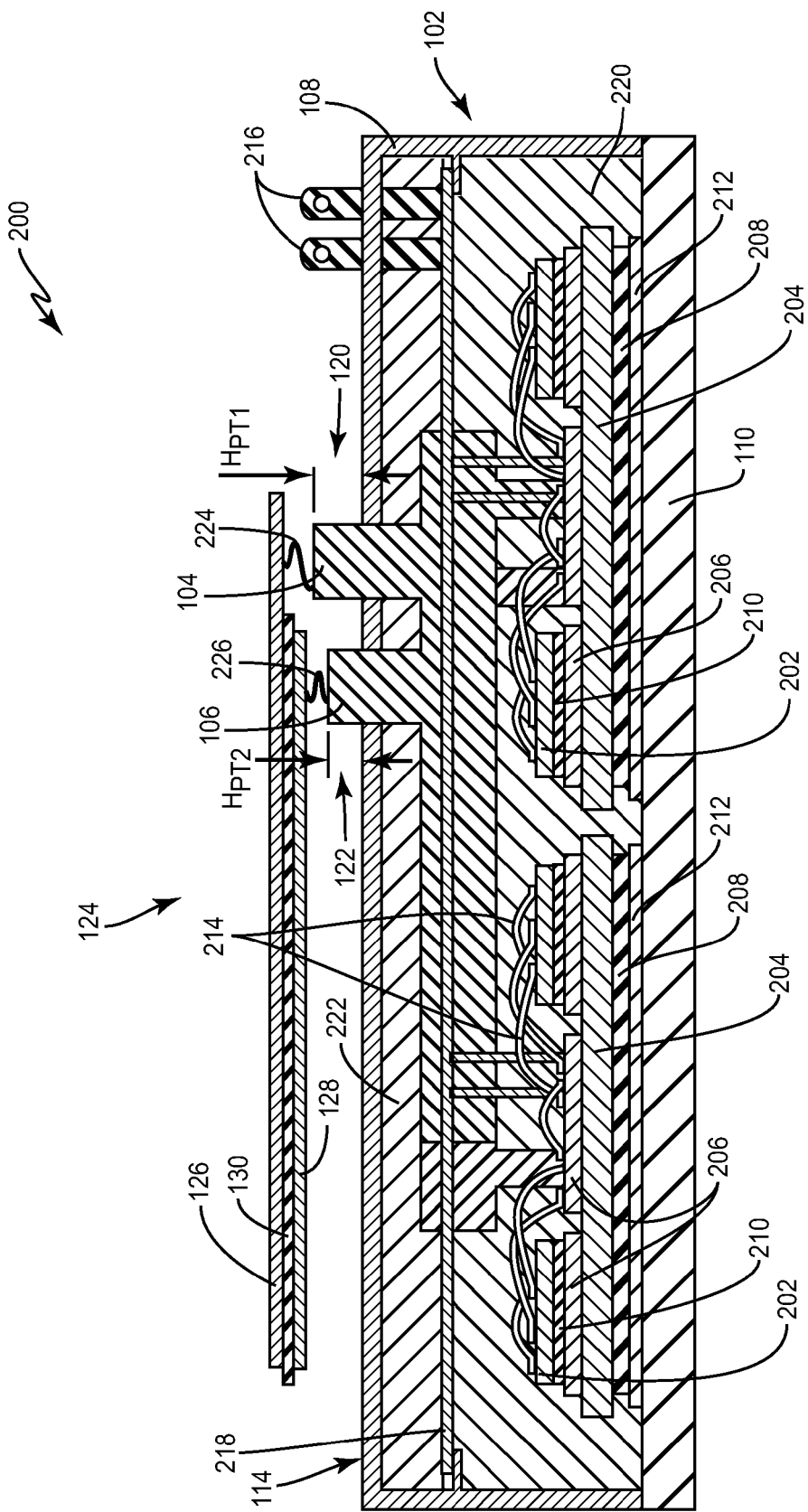
FIG. 3 illustrates a cross-sectional view of a power module with low inductance spring type power terminals.

FIG. 3 illustrates a cross-sectional view of a power module 200 according to another embodiment. The power module 200 includes a housing 102, a plurality of power semiconductor die 202 enclosed within the housing 102, a first power terminal 104 and a second power terminal 106. The power terminals 104, 106 have different heights ($H_{PT1}$ and $H_{PT2}$) as previously described herein. The housing 102 may enclose any number of power semiconductor die 202. The power semiconductor die 202 may be IGBTs, power MOSFETs, JFETs, power diodes, etc. The housing 102 includes a frame 108 attached to a metal body 110. Each power semiconductor die 202 is mounted to the topside of a substrate. For example, in FIG. 3 two power semiconductor die 202 are seen mounted to a first substrate and two other power semiconductor die 202 are seen attached to a second substrate. Alternatively, all die 202 included in the housing 102 may be attached to a single substrate.

Each substrate includes an insulator 204 such as a ceramic substrate with a patterned topside metallization 206 and a bottom side metallization 208. For example, the substrate can be a direct copper bonded (DCB) substrate, a direct aluminum bonded (DAB) substrate or an active metal brazed (AMB) substrate. Alternatively, the substrate may be an insulated metal substrate (IMS) or similar substrate which includes a metal baseplate (e.g. made of aluminum or copper) covered by a dielectric layer such as epoxy and a metal layer such as copper or aluminum on the dielectric layer. In each case, the power semiconductor die 200 are attached to the topside patterned metallization 206 of the corresponding substrate via a solder or other type of joining layer 210. The bottom side substrate metallization 208 is attached to the metal body 110 via a solder or other type of joining layer 212 so that the frame 108 and the metal body 110 collectively enclose the power semiconductor die 202 and substrate(s). The housing 102 can be filled with one or more potting, gel or other materials 220, 222 if desired.

Electrical interconnections 214 within the power module 200 may be provided by bond wires or other types of connections. Control terminals 216 are provided which connect to the die 202 via respective conductive plates 218 inside the module 202. The control terminals 216 also extend outside the module 200 for external connection. The power terminals 104, 106 provide power to the die 202. The power terminals 104, 106 can be bus bars as show in FIG. 3 and connect to the topside patterned metallization 206 of the substrate(s). The first power terminal 104 has a greater height ($H_{PT1}$) than the height ($H_{PT2}$) of the second power terminal 206 as measured from the exterior 114 of the module housing 102. In one embodiment, the first power terminal 104 is a positive supply terminal for the power semiconductor die 202 and the second power terminal 106 is a negative supply terminal for the power semiconductor die 202. In general, the distal end 120 of the first power terminal 104 includes a spring connector 224 and the distal end 122 of the second power terminal 106 also includes a spring connector 226 according to the embodiment shown in FIG. 3. The electrical connector 124 makes contact with the power terminals 104, 106 of the module 200 by being pressed against the spring connectors 224, 226 of the power terminals 104, 106 which compress in response to maintain good electrical contact.

Figure 4:
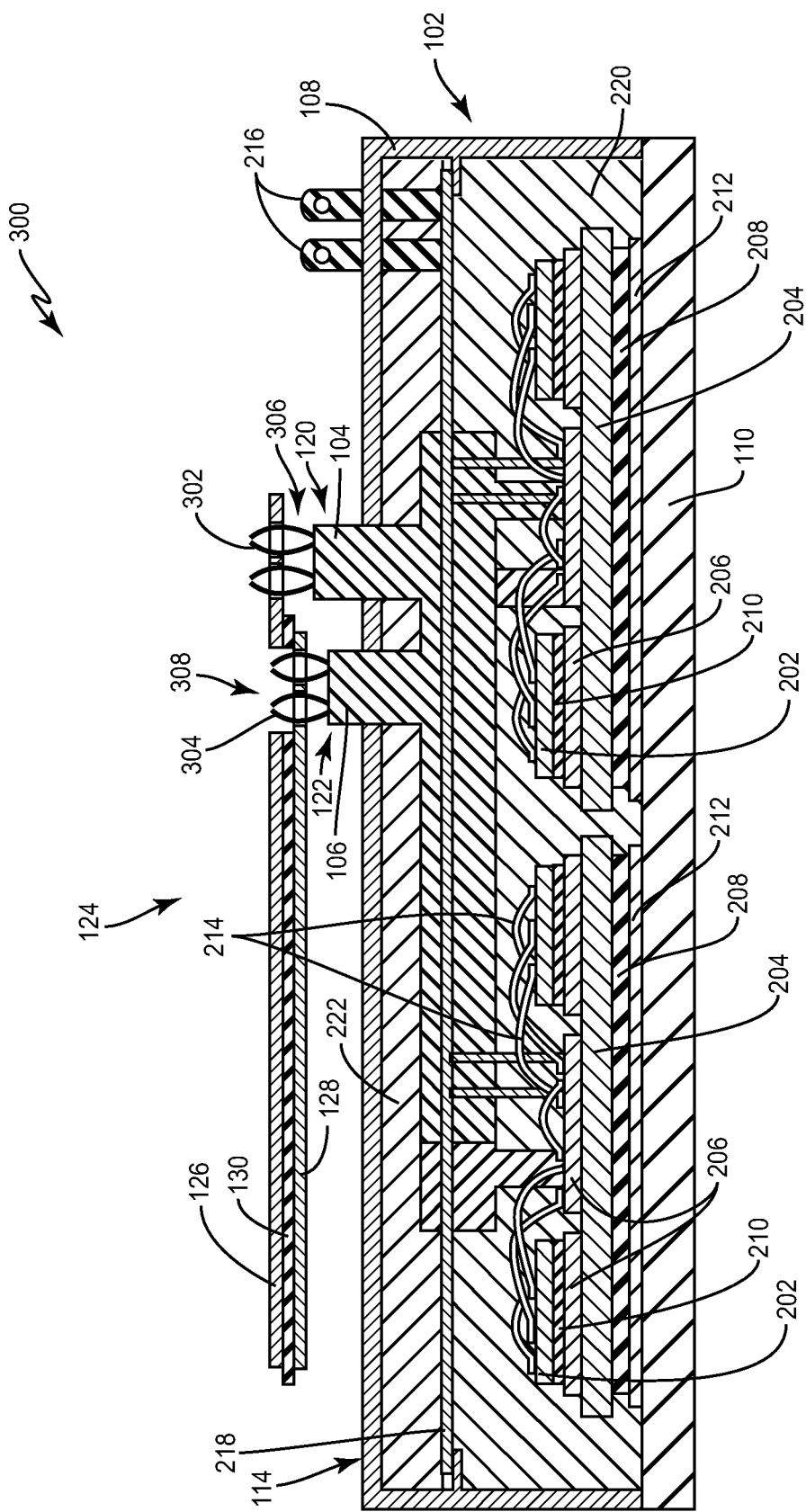
FIG. 4 illustrates a cross-sectional view of a power module with low inductance press-fit type power terminals.

FIG. 4 illustrates a cross-sectional view of a power module 300 according to yet another embodiment. The power module 300 of FIG. 4 is similar to the one shown in FIG. 3, but the distal end 120 of the first power terminal 104 includes a press-fit connector 302 and the distal end 122 of the second power terminal 106 also includes a press-fit connector 304. The insulating material 130 of the electrical connector 124 has corresponding openings 306, 308 for receiving the respective press-fit connectors 302, 304 of the power terminals 104, 106. The electrical connector 124 is secured to the power terminals 104, 106 by pressing down on the connector 124 until the press-fit ends 302, 304 of the power terminals 104, 106 are received by corresponding mating parts of the respective upper and lower conductive layers 126, 128 of the electrical connector 124 as one of ordinary skill in the art readily knows. The press fit-type connections have a restricted attachment height which is easily adaptable to accommodate the different heights of the power terminals 104, 106.

Figure 5:
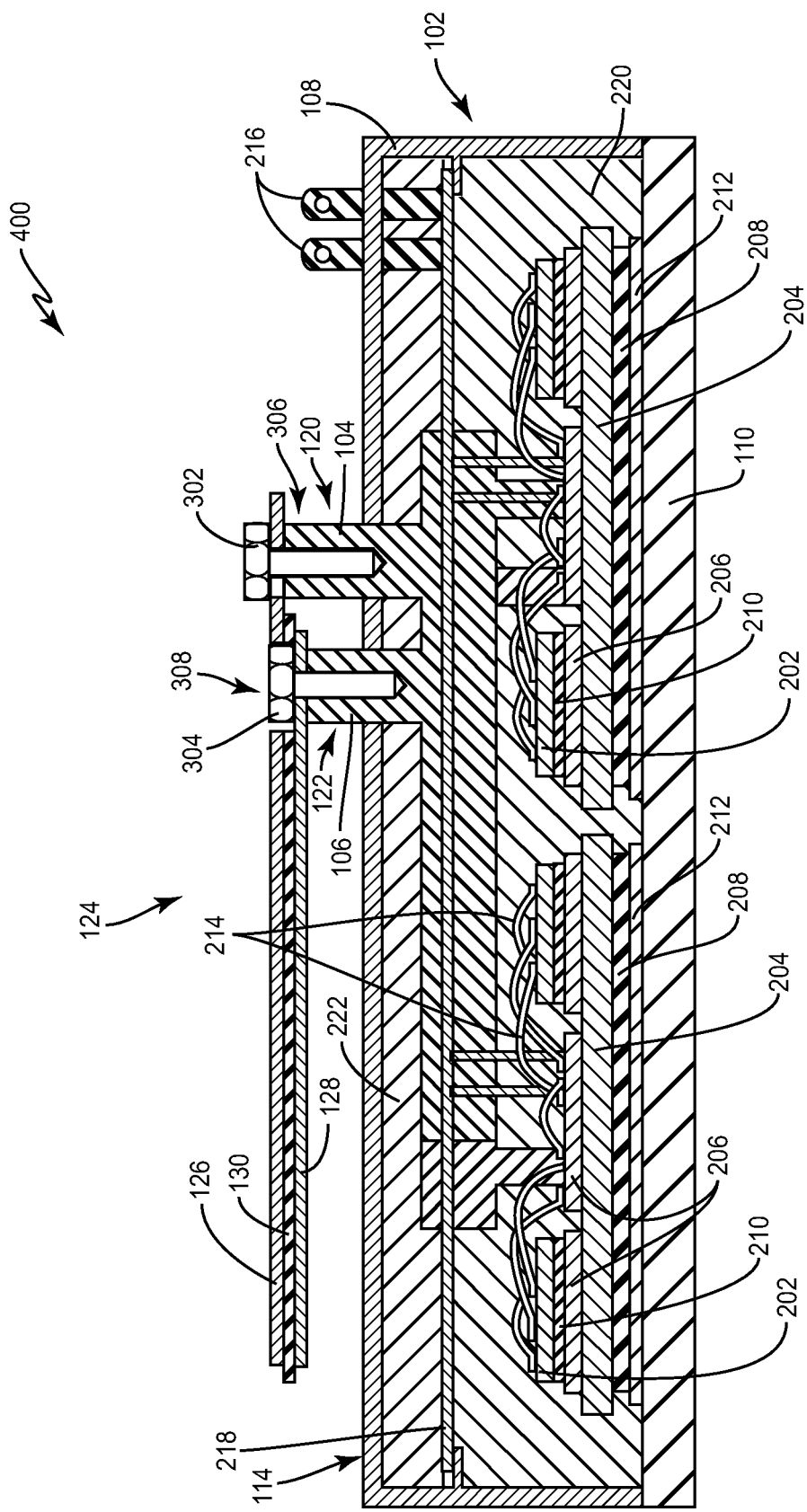
FIG. 5 illustrates a cross-sectional view of a power module with low inductance screw type power terminals.

FIG. 5 illustrates a cross-sectional view of a power module 400 according to yet another embodiment. The power module 400 of FIG. 5 is similar to the one shown in FIG. 3, but the distal end 120 of the first power terminal 104 is configured to receive a screw connector 402 and the distal end 122 of the second power terminal 106 is similarly configured to receive a screw connector 304 instead being spring connectors. The electrical connector 124 is secured to the power terminals 104, 106 of the module 400 using the screw connectors 302, 304 according to this embodiment. The insulating material 130 of the electrical connector 124 has an opening 306 for receiving the head of the screw connector 304 inserted into the distal end 122 of the second power terminal 106. The head of this fastener 304 is rotated and brought into direct contact with the lower conductive layer 128 of the external connector 124 via the opening 306 in the insulating material 130. The insulating material 130 of the electrical connector 124 has another opening or cut-out 308 for receiving the screw connector 302 received by the distal end 120 of the first power terminal 104. The head of this fastener 302 is rotated and brought into direct contact with the upper conductive layer 126 of the external connector 124. Tightening the screws 302, 304 secures the electrical connector 124 to the power terminals 104, 106 of the module 400.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power module, comprising:
   a housing;
   a power semiconductor die enclosed within the housing;
   a first power terminal embedded in the housing and electrically connected to the power semiconductor die, a portion of the first power terminal protruding outward from an external surface of the housing; and
   a second power terminal embedded in the housing and electrically connected to the power semiconductor die and electrically insulated from the first power terminal, a portion of the second power terminal protruding outward from the external surface of the housing by a distance less than the portion of the first power terminal so that the module has power connections with different heights.

2. A power module according to claim 1, wherein the housing comprises a frame attached to a metal body, and wherein the power semiconductor die is mounted to a first side of a substrate, the substrate having a second opposing side attached to the metal body so that the frame and the metal body collectively enclose the power semiconductor die and the substrate.

3. A power module according to claim 1, wherein the portion of the first power terminal protruding outward from the external surface of the housing is a spring connector and the portion of the second power terminal protruding outward from the external surface of the housing is a spring connector.

4. A power module according to claim 1, wherein the portion of the first power terminal protruding outward from the external surface of the housing is a screw connector and the portion of the second power terminal protruding outward from the external surface of the housing is a screw connector.

5. A power module according to claim 1, wherein the portion of the first power terminal protruding outward from the external surface of the housing is a press-fit connector and the portion of the second power terminal protruding outward from the external surface of the housing is a press-fit connector.

6. A power module according to claim 1, wherein the first power terminal is a positive supply terminal for the power semiconductor die and the second power terminal is a negative supply terminal for the power semiconductor die.

7. A power module, comprising:
   a housing;
   a power semiconductor die enclosed within the housing;
   a first power terminal having a proximal end embedded in the housing and a distal end spaced away from the housing by a first distance, the first power terminal being electrically connected to the power semiconductor die; and
   a second power terminal having a proximal end embedded in the housing and a distal end spaced away from the housing by a second distance less than the first distance, the second power terminal being electrically connected to the power semiconductor die and electrically insulated from the first power terminal.

8. A power module according to claim 7, wherein the housing comprises a frame attached to a metal body, and wherein the power semiconductor die is mounted to a first side of a substrate, the substrate having a second opposing side attached to the metal body so that the frame and the metal body collectively enclose the power semiconductor die and the substrate.

9. A power module according to claim 7, wherein the distal end of the first power terminal is a spring connector and the distal end of the second power terminal is a spring connector.

10. A power module according to claim 7, wherein the distal end of the first power terminal is a screw connector and the distal end of the second power terminal is a screw connector.

11. A power module according to claim 7, wherein the distal end of the first power terminal is a press-fit connector and the distal end of the second power terminal is a press-fit connector.

12. A power module according to claim 7, wherein the first power terminal is a positive supply terminal for the power semiconductor die and the second power terminal is a negative supply terminal for the power semiconductor die.

13. A power module system, comprising:
a housing;
a power semiconductor die enclosed within the housing;
a first power terminal having a proximal end embedded in the housing and a distal end spaced away from the housing by a first distance, the first power terminal being electrically connected to the power semiconductor die;
a second power terminal having a proximal end embedded in the housing and a distal end spaced away from the housing by a second distance less than the first distance, the second power terminal being electrically connected to the power semiconductor die and electrically insulated from the first power terminal; and
an electrical connector comprising a first conductive layer and a second conductive layer separated from the first conductive layer by an insulating material, the first conductive layer being connected to the distal end of the first power terminal and the second conductive layer being connected to the distal end of the second power terminal.

14. A power module according to claim 13, wherein the housing comprises a frame attached to a metal body, and wherein the power semiconductor die is mounted to a first side of a substrate, the substrate having a second opposing side attached to the metal body so that the frame and the metal body collectively enclose the power semiconductor die and the substrate.

15. A power module according to claim 13, wherein the distal end of the first power terminal is a spring connector and the distal end of the second power terminal is a spring connector.

16. A power module according to claim 13, wherein the distal end of the first power terminal is a screw connector and the distal end of the second power terminal is a screw connector.

17. A power module according to claim 13, wherein the distal end of the first power terminal is a press-fit connector and the distal end of the second power terminal is a press-fit connector.

18. A power module according to claim 13, wherein the first power terminal is a positive supply terminal for the power semiconductor die and the second power terminal is a negative supply terminal for the power semiconductor die.

19. A power module according to claim 13, wherein a difference between the first and second distances corresponds to a thickness of the insulating material of the electrical connector.

20. A power module according to claim 13, wherein the first and second conductive layers are flat.

21. A power module according to claim 13, wherein the insulating material of the electrical connector has a first opening aligned with the first power terminal and a second opening aligned with the second power terminal.

22. A power module according to claim 13, wherein the second conductive layer is disposed closer to the housing than the first conductive layer, and wherein the first conductive layer contacts the first power terminal through the first opening in the insulating material.

* * * * *